(12) United States Patent
Ransijn et al.

(10) Patent No.: US 11,621,872 B2
(45) Date of Patent: Apr. 4, 2023

(54) DECISION FEEDBACK EQUALIZATION TAP SYSTEMS AND RELATED APPARATUSES AND METHODS

(71) Applicant: Microchip Technology Incorporated, Chandler, AZ (US)

(72) Inventors: Johannes G. Ransijn, Salem, MA (US); Ravish Soni, Madhya Pradesh (IN)

(73) Assignee: Microchip Technology Incorporated, Chandler, AZ (US)

(*) Notice: Subject to any disclaimer, the term of this patent is extended or adjusted under 35 U.S.C. 154(b) by 0 days.

(21) Appl. No.: 17/455,506

(22) Filed: Nov. 18, 2021

(65) Prior Publication Data

US 2022/0158875 A1  May 19, 2022

Related U.S. Application Data

(60) Provisional application No. 63/198,871, filed on Nov. 19, 2020.

(51) Int. Cl.
| | | |
|---|---|---|
| *H04L 25/03* | (2006.01) | |
| *H03K 3/356* | (2006.01) | |
| *H04L 7/00* | (2006.01) | |
| *H04L 25/06* | (2006.01) | |

(52) U.S. Cl.
CPC ... *H04L 25/03057* (2013.01); *H03K 3/35613* (2013.01); *H04L 7/0058* (2013.01); *H04L 25/06* (2013.01); *H04L 2025/0349* (2013.01)

(58) Field of Classification Search
CPC .......... H03K 3/356104; H03K 3/35613; H04L 7/0058; H04L 25/03006; H04L 25/03019; H04L 25/0357; H04L 25/03267; H04L 25/06; H04L 2025/0349
USPC .... 375/232, 233, 257, 348; 326/85, 87, 103; 708/322, 323
See application file for complete search history.

(56) References Cited

U.S. PATENT DOCUMENTS

| | | | | |
|---|---|---|---|---|
| 5,051,981 | A * | 9/1991 | Kline ................. | H03H 17/0294 370/290 |
| 8,624,632 | B2 * | 1/2014 | Bulzacchelli .... | H03K 3/356139 327/212 |
| 10,243,531 | B1 * | 3/2019 | Thiagarajan ........ | H03F 3/45659 |
| 2008/0187037 | A1 | 8/2008 | Bulzacchelli et al. | |
| 2010/0054324 | A1 * | 3/2010 | Bulzacchelli ..... | H04L 25/03057 375/233 |

(Continued)

OTHER PUBLICATIONS

Bulzacchelli, "Equalization form Electrical Links: current Design Techniques and Future Directions", IEEE Solid-State Circuits Magazine, vol. 7, No. 4, (Oct. 1, 2015) pp. 23-31.

(Continued)

*Primary Examiner* — Young T. Tse
(74) *Attorney, Agent, or Firm* — TraskBritt (57) ABSTRACT

Decision feedback equalization (DFE) tap systems and related apparatuses and methods are disclosed. An apparatus includes output nodes to provide output signals, a complementary metal-oxide-semiconductor (CMOS) DFE tap electrically connected to the output nodes, and a current integrating summer electrically connected to the output nodes. The current integrating summer is to reset the output nodes to a common mode voltage potential.

18 Claims, 4 Drawing Sheets

(56) References Cited

U.S. PATENT DOCUMENTS

2012/0313703 A1\* 12/2012 Agrawal ................. H03F 3/211
                                                        330/253
2013/0214865 A1   8/2013 Bulzacchelli et al.
2014/0177697 A1\* 6/2014 Nguyen ............ H04L 25/03057
                                                        375/233
2017/0264467 A1\* 9/2017 Neto ................... H04L 25/0292

OTHER PUBLICATIONS

International Search Report from International Application No. PCT/US2021/072481, dated Mar. 16, 2022, 5 pages.
International Written Opinion from International Application No. PCT/US2021/072481, dated Mar. 16, 2022, 11 pages.

\* cited by examiner

FIG. 4

DECISION FEEDBACK EQUALIZATION TAP SYSTEMS AND RELATED APPARATUSES AND METHODS

CROSS-REFERENCE TO RELATED APPLICATION

This application claims the benefit under 35 U.S.C. § 119(e) of U.S. Provisional Patent Application No. 63/198,871, filed Nov. 19, 2020, and titled "DECISION FEEDBACK EQUALIZATION TAPS AND CURRENT INTEGRATING SUMMERS AND RELATED SYSTEMS, METHODS, AND DEVICES," the entire disclosure of which is hereby incorporated herein by reference.

TECHNICAL FIELD

This disclosure relates generally to decision feedback equalization (DFE) taps and current integrating summers, and more specifically to current integrating summers that reset to common mode voltage potentials rather than to power supply voltage potentials.

BACKGROUND

Long reach channel links working at high data rates have a loss at the Nyquist frequency, which may cause inter-symbol interference (ISI) and may rely on decision feedback equalization (DFE) to equalize the loss or cancel the ISI. As a result, there is a market demand for high data rate serializer deserializer (SERDES) devices that include DFE taps that operate at fast data rates.

BRIEF DESCRIPTION OF THE DRAWINGS

While this disclosure concludes with claims particularly pointing out and distinctly claiming specific examples, various features and advantages of examples within the scope of this disclosure may be more readily ascertained from the following description when read in conjunction with the accompanying drawings, in which:

DETAILED DESCRIPTION

In the following detailed description, reference is made to the accompanying drawings, which form a part hereof, and in which are shown, by way of illustration, specific examples of examples in which the present disclosure may be practiced. These examples are described in sufficient detail to enable a person of ordinary skill in the art to practice the present disclosure. However, other examples enabled herein may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. In some instances, similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example or this disclosure to the specified components, steps, features, functions, or the like.

It will be readily understood that the components of the examples as generally described herein and illustrated in the drawings could be arranged and designed in a wide variety of different configurations. Thus, the following description of various examples is not intended to limit the scope of the present disclosure, but is merely representative of various examples. While the various aspects of the examples may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is to execute computing instructions (e.g., software code) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As previously mentioned, there is a market demand for high data rate serializer deserializer (SERDES) devices that include DFE taps that operate at fast data rates (e.g., 32 or more gigatransfers per second). One way to increase the speed of taps is to drive the DFE taps with more power (e.g., to increase the slew rate of signals). Driving the DFE taps with more power would, however, decrease power efficiency, especially for high tap count DFE designs. In order to provide a faster operating DFE tap without incurring such a power efficiency decrease, a current integrating summer may be reset using a common mode voltage potential rather than with a power supply voltage potential (e.g., a power supply high voltage potential VDD). The common mode voltage potential may be set substantially at midway between a power supply high voltage potential VDD and a power supply low voltage potential VSS (e.g., at substantially 55% of a range from the power supply low voltage potential VSS and the power supply high voltage potential VDD, which would be 0.55 times VDD if VSS is zero volts, to account for any voltage potential drop across a switch delivering the common mode voltage potential). By way of non-limiting examples, VDD may be five volts (5 V), 3.3 V, 1.5 volts, or any other voltage potential level above VSS.

Current integrating summers having output nodes that reset to a power supply voltage potential (e.g., VDD) during a reset phase may cause an output common mode voltage potential to depend on an integration current to output capacitance ratio and the integration period. Hence, the output common mode voltage potential may vary with process-voltage-temperature (PVT) and data rate, and may require calibration to achieve a desired value. Also, differential and common mode voltage potentials may only be valid at the end of a one unit interval (1UI) integration period (e.g., one bit period). Also, where a power supply voltage potential is used to reset the current integrating summer, DFE taps carry both a signal (differential) current and a common mode current. Devices (e.g., transistors) of these DFE taps are sized to carry both the signal current and the common mode current, which requires the use of large enough devices to accommodate switching of a relatively large current. As used herein, the terms "size" and "sized," when used with reference to a transistor, refers to a size of a gate of the transistor, especially the width of the gate. The relatively large size of the devices to accommodate both the signal current and the common mode current may limit operational speed (e.g., switching speed) of the devices. Also, the relatively large current (including both the signal and common mode current) itself may limit operational speed of the devices and consume a relatively large amount of power.

Various examples disclosed herein are directed to complementary metal oxide semiconductor (CMOS) taps for a DFE with a current integrating summer. The CMOS DFE taps disclosed herein reset to a desired common mode voltage potential for the current integrating summer rather than to a power supply voltage potential. As a result, the DFE taps may carry substantially only signal current and little or no common mode current. Since the devices of the DFE taps carry substantially only signal current and little or no common mode current, the devices used in DFE taps of the present disclosure may carry less current than those of DFE taps used in conjunction with power supply voltage potential resets of current integrating summers. Consequently, various examples disclosed herein may include devices of the DFE taps that are smaller in size than those of DFE taps used in conjunction with power supply voltage potential resets of current integrating summers. The relatively small size of the devices of DFE taps according to examples disclosed herein may have faster operation and consume less power because of their small size and because of the smaller currents switched thereby. Furthermore, examples disclosed herein may not require calibration for output common mode voltage potential.

The CMOS DFE tap designs disclosed herein may be used in high-speed receiver devices. By way of non-limiting example, the CMOS DFE tap designs disclosed herein may be used in high-speed SERDES devices (e.g., high-speed data communication receivers). As a specific, non-limiting example the CMOS DFE tap designs disclosed herein may be used in peripheral component interconnect express (PCIe) generation five receivers, which may operate at 32 gigatransfers per second (GT/s).

Figure 1:
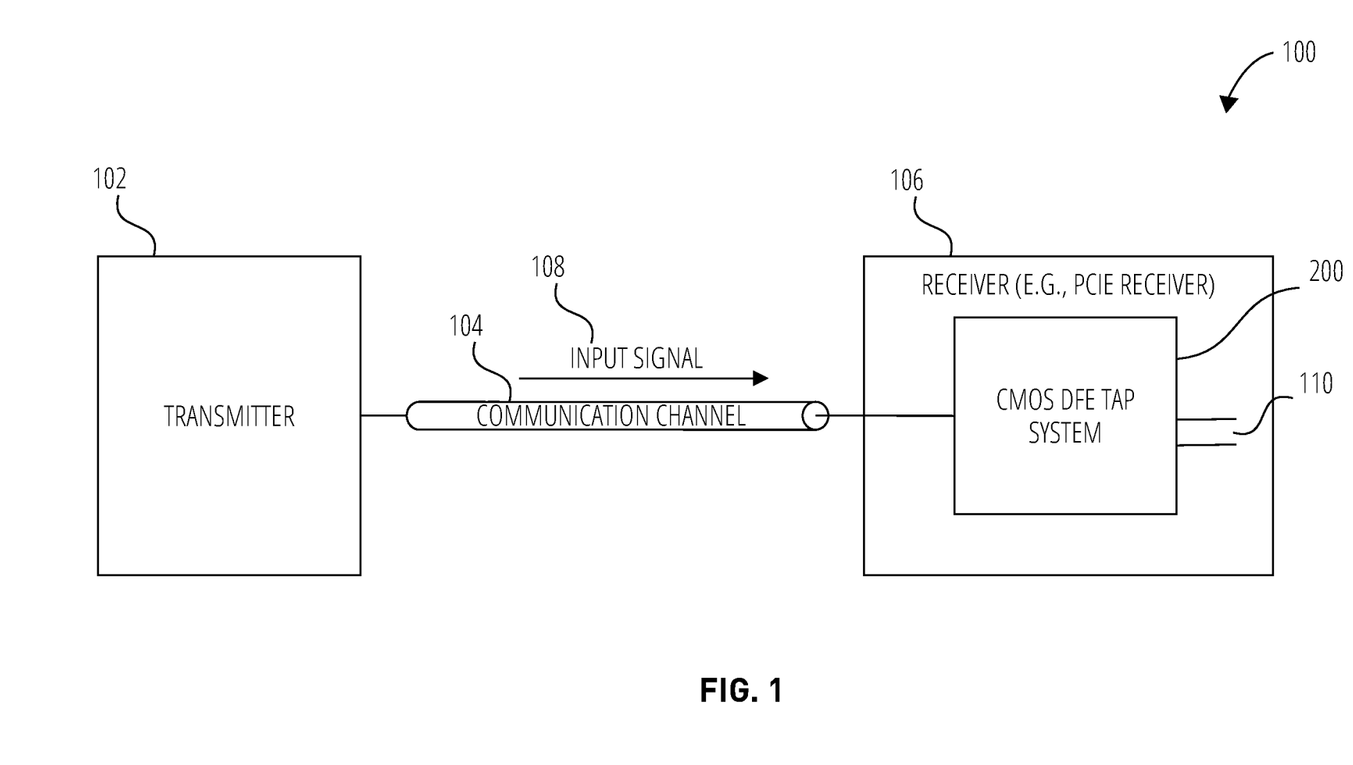
FIG. 1 is a block diagram of a communication system, according to some examples.

FIG. 1 is a block diagram of a communication system 100, according to some examples. The communication system 100 includes a transmitter 102, a receiver 106, and a communication channel 104 electrically connecting the transmitter 102 to the receiver 106. In some examples, the receiver 106 is a peripheral communication interface express (PCIe) receiver. The receiver 106 receives, via the communication channel 104, an input signal 108 from the transmitter 102. The receiver 106 includes a CMOS DFE tap system 200. As will be discussed in more detail with reference to FIG. 2, the CMOS DFE tap system 200 includes a current integrating summer to reset output nodes 110 of the CMOS DFE tap system 200 to a common mode voltage potential that is substantially halfway between a power supply high voltage potential and a power supply low voltage potential.

Figure 2:
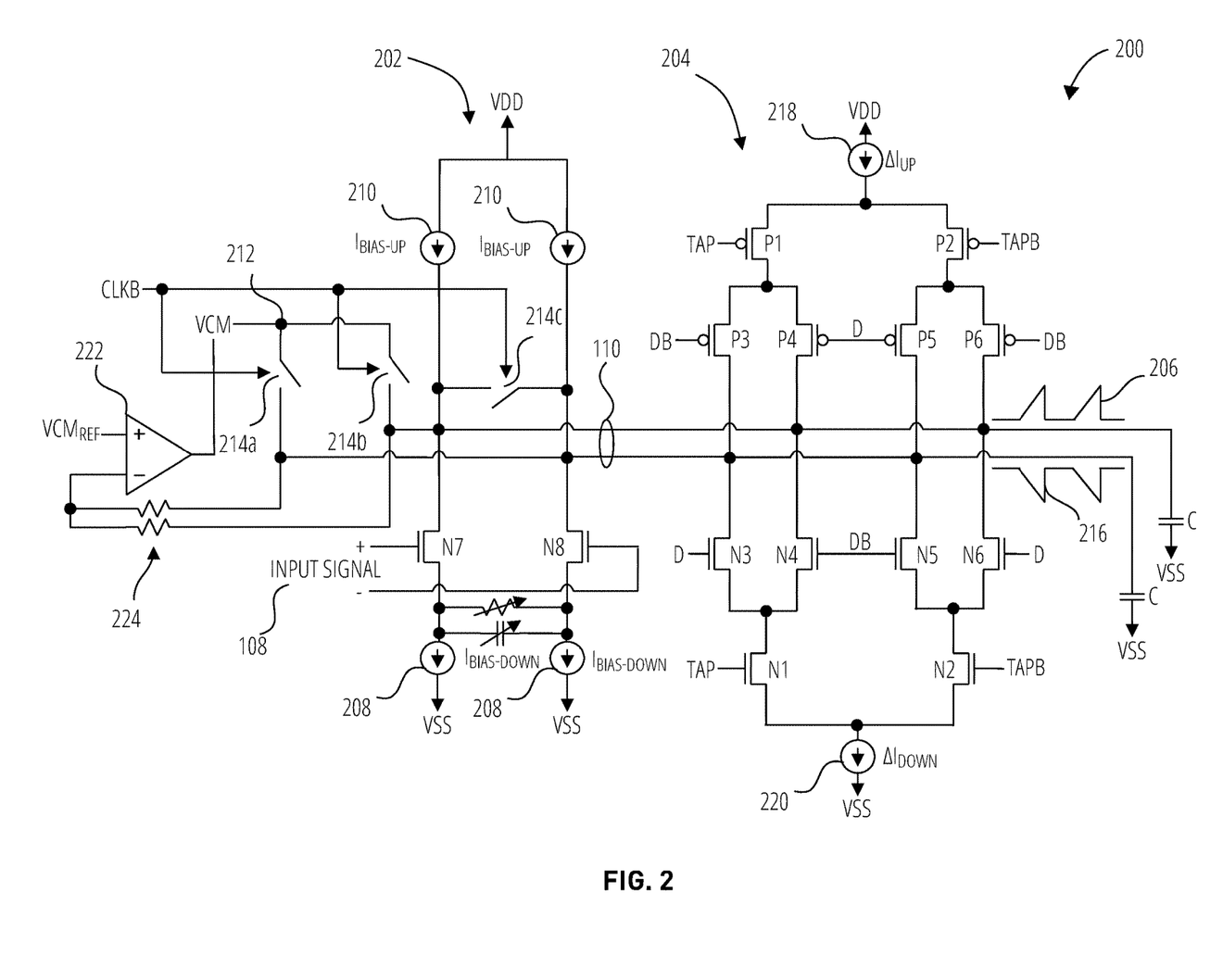
FIG. 2 is a circuit schematic illustration of a complementary metal-oxide-semiconductor (CMOS) decision feedback equalization (DFE) tap system of a receiver of the communication system of FIG. 1, according to some examples.

FIG. 2 is a circuit schematic illustration of the CMOS DFE tap system 200 of the receiver 106 of the communication system 100 of FIG. 1, according to some examples. The CMOS DFE tap system 200 includes output nodes 110, a current integrating summer 202, and a CMOS DFE tap 204. The current integrating summer 202 and the CMOS DFE tap 204 are electrically connected to the output nodes 110, which output nodes 110 are each electrically connected to respective capacitors C. The current integrating summer 202 is to reset the output nodes 110 to a common mode voltage potential VCM.

The current integrating summer 202 includes both pull-up current sources 210 and pull-down current sources 208. The pull-up current sources 210 may source pull-up bias currents $I_{BIAS-UP}$ and the pull-down current sources 208 may source pull-down bias currents $I_{BIAS-DOWN}$. The output nodes 110 are each electrically connected between respective ones of the pull-up current sources 210 and the pull-down current sources 208. Accordingly, the current integrating summer 202 may substantially always draw a fixed static current (e.g., two times $I_{bias-up}$) in contrast to a current integrating summer that resets to a power supply voltage potential (e.g., a power supply high voltage potential VDD). This fixed static current, however, may be compensated for because of relatively lower currents drawn by the CMOS DFE tap 204, especially if the CMOS DFE tap system 200 includes a large number of taps.

The current integrating summer 202 also includes transistors N7 and N8 electrically connected respectively between the pull-up current sources 210 and the pull-down current sources 208. Gate terminals of transistors N7 and N8 receive the input signal 108, which is a differential signal. The output nodes 110 are electrically connected respectively between the pull-up current sources 210 and transistors N7 and N8.

The current integrating summer 202 includes a common mode voltage potential VCM node 212 selectively electrically connectable to each of the output nodes 110 responsive to a clock signal CLKB. By way of non-limiting example, the current integrating summer 202 may include electrically controllable switches 214a, 214b electrically connected respectively from the output nodes 110 to the common mode voltage potential VCM node 212. The current integrating summer 202 also includes an electrically controllable switch 214c electrically connected from one of the output nodes 110 to another of the output nodes 110. A differential switch such as the electrically controllable switch 214c is more effective in resetting the differential signal for a given switch size than the common-mode electrically controllable switches 214a, 214b alone. Absent the electrically controllable switch 214c, the electrically controllable switches 214a, 214b may be four times larger than with the electrically controllable switch 214c. By way of non-limiting example, the electrically controllable switches 214a-214c may be metal-oxide-semiconductor field effect transistors (MOSFETs). The electrically controllable switches 214a-214c are controlled using the clock signal CLKB (e.g., the clock signal CLKB may be provided to gate terminals of MOSFETs used for the electrically controllable switches 214a-214c).

The current integrating summer 202 operates alternately in an integrate mode and in a reset mode. During the integrate mode the current integrating summer 202 maintains a first output signal 206, on a first of the output nodes 110, higher than the common mode voltage potential VCM and a second output signal 216, on a second of the output nodes 110, lower than the common mode voltage potential VCM for substantially an entirety of the integrate mode. During the reset mode, the current integrating summer 202 resets the output nodes 110 to the common mode voltage potential VCM by closing the electrically controllable switches 214a-214c. In some examples the common mode voltage potential VCM is substantially halfway between the power supply high voltage potential VDD and the power supply low voltage potential VSS. In some examples, the common mode voltage potential VCM is substantially 55% of the way from the power supply low voltage potential VSS to the power supply high voltage potential VDD to accommodate for any voltage potential drop across the electrically controllable switches 214a-214c.

The CMOS DFE tap 204 includes transistors N1-N6, P1-P6. The CMOS DFE tap 204 also includes both a pull-up current source 218, which sources a current $\Delta I_{UP}$, and a pull-down current source 220, which sources a current $\Delta I_{DOWN}$. Transistors P1-P6 may be pull-up transistors (e.g., P-type metal oxide semiconductor field effect transistors). Transistors P3 and P4 may be a pair of pull-up transistors, and transistors P5 and P6 may also be a pair of pull-up transistors. Transistors N1-N6 may be pull-down transistors (e.g., N-type metal oxide semiconductor field effect transistors). Transistors N3 and N4 may be a pair of pull-down transistors and transistors N5 and N6 may also be a pair of pull-down transistors.

The pull-up current source 218 is electrically connected from a power supply high voltage potential node VDD to source terminals of transistors P1 and P2. Source terminals of transistors P3 and P4 are electrically connected to a drain terminal of transistor P1. Drain terminals of transistors P3 and P4 are electrically connected, respectively, to the output nodes 110. Source terminals of transistors P5 and P6 are electrically connected to a drain terminal of transistor P2. Drain terminals of transistors P5 and P6 are electrically connected, respectively, to the output nodes 110.

The pull-down current source 220 is electrically connected from a power source low voltage potential node VSS to source terminals of transistors N1 and N2. Source terminals of transistors N3 and N4 are electrically connected to a drain terminal of transistor N1. Drain terminals of transistors N3 and N4 are electrically connected, respectively, to the output nodes 110 with the drain terminal of transistor N3 electrically connected to the drain terminal of transistor P3 and the drain terminal of transistor N4 electrically connected to the drain terminal of transistor P4. Source terminals of transistors N5 and N6 are electrically connected to a drain terminal of transistor N2. Drain terminals of transistors N5 and N6 are electrically connected, respectively, to the output nodes 110 with the drain terminal of transistor N5 electrically connected to the drain terminal of transistor P5 and the drain terminal of transistor N6 electrically connected to the drain terminal of transistor P6. Accordingly, the pairs of pull-up transistors (P3 and P4, and P5 and P6) include pull-up drain terminals and the pairs of pull-down transistors (N3 and N4, N5 and N6) include pull-down drain terminals. The pull-down drain terminals are electrically connected to the pull-up drain terminals, and the pull-down drain terminals and the pull-up drain terminals are electrically connected, respectively, to the output nodes 110.

Gate terminals of transistors N1 and P1 may be electrically connected together. A tap signal TAP may be provided to the gate terminals of transistors N1 and P1. Gate terminals of transistors N2 and P2 may also be electrically connected together. A tap signal TAPB may be provided to the gate terminals of transistors N2 and P2. Gate terminals of transistors N3, N6, P4, and P5 may be electrically connected together. A signal D may be provided to the gate terminals of transistors N3, N6, P4, and P5. Gate terminals of transistors N4, N5, P3, and P6 may be electrically connected together. A signal DB may be provided to the gate terminals of transistors N4, N5, P3, and P6. Signal D represent the history bit, and signal DB represents the complement of the history bit. Signals TAP, TAPB, respectively, control the polarity of equalization to be performed.

The transistors N1-N6, P1-P6 of the CMOS DFE tap 204 are sized to carry substantially only signal current (e.g., sized to accommodate a signal current but not a common mode current). Accordingly, the transistors N1-N6, P1-P6 of the CMOS DFE tap 204 are smaller than those that would be used in a DFE tap system having a current integrating summer that resets to a power supply voltage potential. Since the CMOS DFE tap 204 carries substantially only signal current and little to no common mode current, a smaller current is carried by the CMOS DFE tap 204 as compared to that of a DFE tap having a current integrating summer that is reset to a power supply voltage potential.

A tap weight of the CMOS DFE tap 204 may be defined as:

Tap Weight=$((\Delta I_{UP}+\Delta I_{DOWN})*1UI)/C$.

where C is the capacitance of the capacitors C on each of the output nodes 110. A feedback loop may be used to generate the common mode voltage potential VCM. For example, the common mode voltage potential node 212 may be electrically connected to an output terminal of an operational amplifier 222, a non-inverting input terminal of the operational amplifier 222 may be provided with a reference common mode voltage potential $VCM_{REF}$, and an inverting input terminal of the operational amplifier 222 may be electrically connected, through resistors 224, to the output nodes 110. The operational amplifier 222 may generate the common mode voltage potential VCM by driving the common mode voltage potential node 212 to the reference common mode voltage potential $VCM_{REF}$, which may be provided using a resistor voltage divider circuit. The common mode voltage potential VCM may be valid (e.g., substantially equal to the reference common mode voltage potential $VCM_{REF}$) at any instant if $\Delta I_{UP}$ and $\Delta I_{DOWN}$ match. An analog loop (e.g., a feedback loop) may force $\Delta I_{UP}$ and $\Delta I_{DOWN}$ to be at least substantially equal to each other. Also, the CMOS DFE tap system 200 may not require a calibration scheme for the output common mode voltage potential VCM because the analog loop may regulate the common mode voltage potential VCM.

Figure 3:
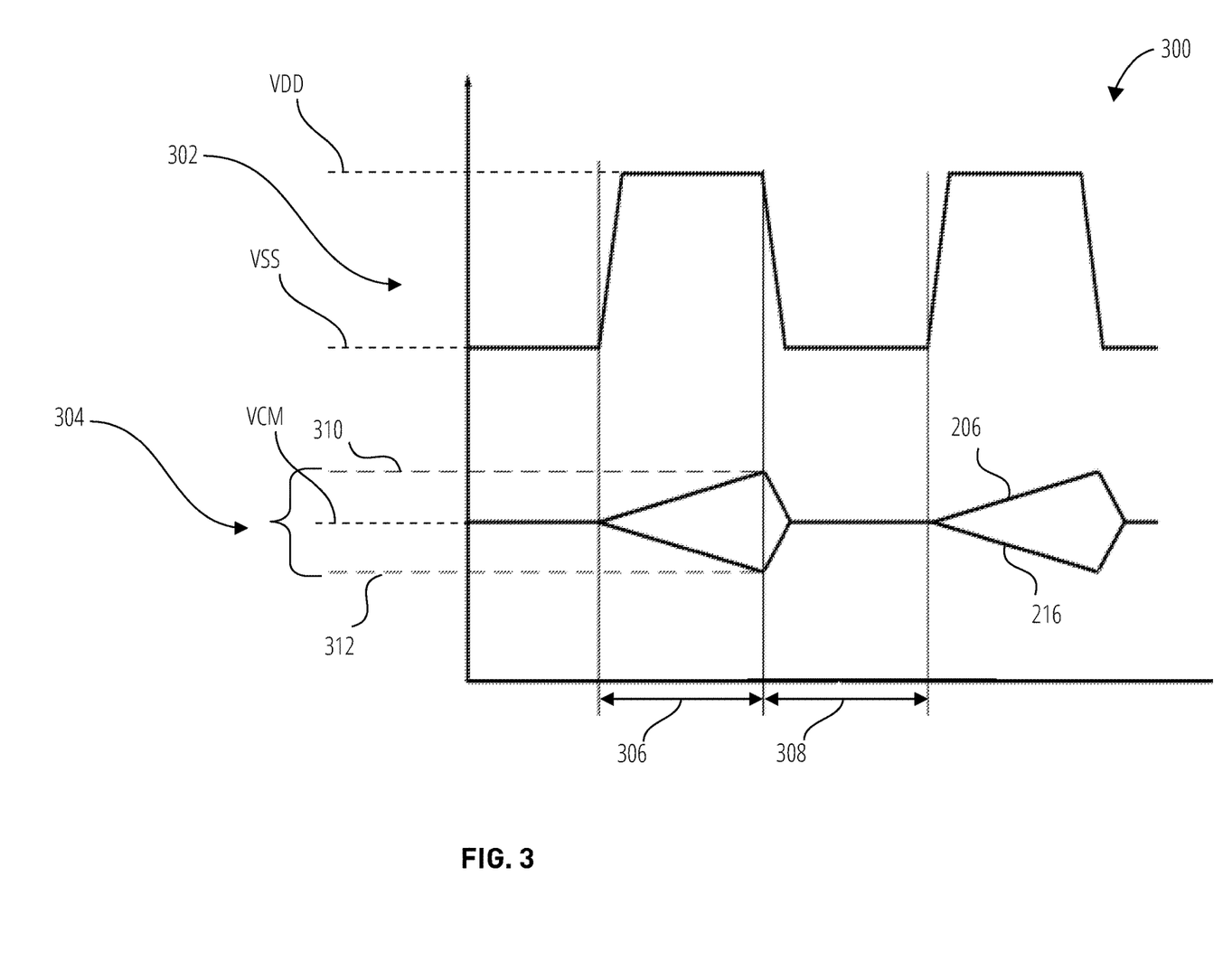
FIG. 3 is a plot illustrating a clock signal and a differential output of the CMOS DFE tap system of FIG. 2, according to some examples.

FIG. 3 is a plot 300 illustrating a clock signal 302 (e.g., CLKB in FIG. 2) and a differential output signal 304 (e.g., the difference between first output signal 206 and second output signal 216 of FIG. 2) of the CMOS DFE tap system 200 of FIG. 2, according to some examples. Referring to FIG. 2 and FIG. 3 together, the CMOS DFE tap system 200 operates in an integrate mode 306, which may occur during a logic level high voltage potential (e.g., substantially VDD) of the clock signal 302, such that electrically controllable switches 214a-214c are open. The CMOS DFE tap system 200 also operates in a reset mode 308 during a logic level low voltage potential (e.g., substantially VSS) of the clock signal 302, such that electrically controllable switches 214a-214c are closed. The clock signal 302 may electrically control the current integrating summer 202 to electrically connect the output nodes 110 to a common mode voltage potential VCM rather than a power supply voltage potential (e.g., VDD) during reset mode 308. Also, the clock signal 302 may electrically control the current integrating summer 202 to disconnect the current integrating summer 202 from the common mode voltage potential VCM during integrate mode 306.

The differential output signal 304 includes the first output signal 206 and the second output signal 216 illustrated in the CMOS DFE tap system 200 of FIG. 2. During the reset mode 308 the first output signal 206 and the second output signal 216 may be reset to the common mode voltage potential VCM because the current integrating summer 202 resets to the common mode voltage potential VCM. During the integrate mode 306 the first output signal 206 may charge to a first level 310 greater than the common mode voltage potential VCM. Also, during the integrate mode 306 the second output signal OUTN may discharge to a second level 312 less than the common mode voltage potential VCM. The current integrating summer 202 may transform the input signal 108 voltage potential into a differential current to/from output nodes 110, which may charge the capacitors C according to the first output signal 206 and the second output signal 216.

It is noted that the common mode voltage potential VCM is valid at any instant during the integrate mode 306 because the first output signal 206 is substantially always greater than the common mode voltage potential VCM during the integrate mode 306 and the second output signal 216 is substantially always less than the common mode voltage potential VCM during the integrate mode 306. As a result, the common mode voltage potential VCM of the CMOS DFE tap system 200 of FIG. 2 does not depend on the integration current or the data rate and the common mode voltage potential VCM does not need to be calibrated. Rather, the common mode voltage potential VCM may be managed with an analog loop to reduce any current mismatch between $\Delta I_{UP}$ and $\Delta I_{DOWN}$. The output signals 206, 216 at the output nodes 110 are therefore differential signals without a common-mode component. The transistors N1-N6, P1-P6 of the CMOS DFE tap 204 may switch a smaller current than those of a CMOS DFE tap system that is reset to a power supply voltage potential, and may thus be smaller and faster.

The CMOS DFE tap system 200, which includes a CMOS DFE tap 204 with reset to a desired VCM, may operate faster than a CMOS DFE tap system reset to a power supply voltage potential without incurring a power penalty (e.g., without driving the CMOS DFE tap 204 with more power). Also, the output common mode voltage potential VCM is valid at substantially any instant as the mismatch between pull-up and pull-down currents can be reduced with feedback in an analog loop. More specifically, an average of a sum of the currents in the feedback loop that provides the common mode voltage potential VCM is forced to zero. Accordingly, a common mode voltage potential calibration scheme is avoided. This is in contrast to a CMOS DFE tap system that is reset to a power supply voltage potential, in which the common mode voltage potential VCM is only valid at an end of the 1UI of an integrate mode. In contrast to examples disclosed herein, the common mode voltage potential in an example where the CMOS DFE tap system is reset to a power supply voltage potential depends on the integration current, the data rate, and the capacitance and needs to be calibrated. Also, in contrast to examples disclosed herein, as the corresponding tap devices (transistors) would switch a relatively large current, which would require the transistors of the tap to be relatively large, limiting their speed and increasing their power requirements.

Figure 4:
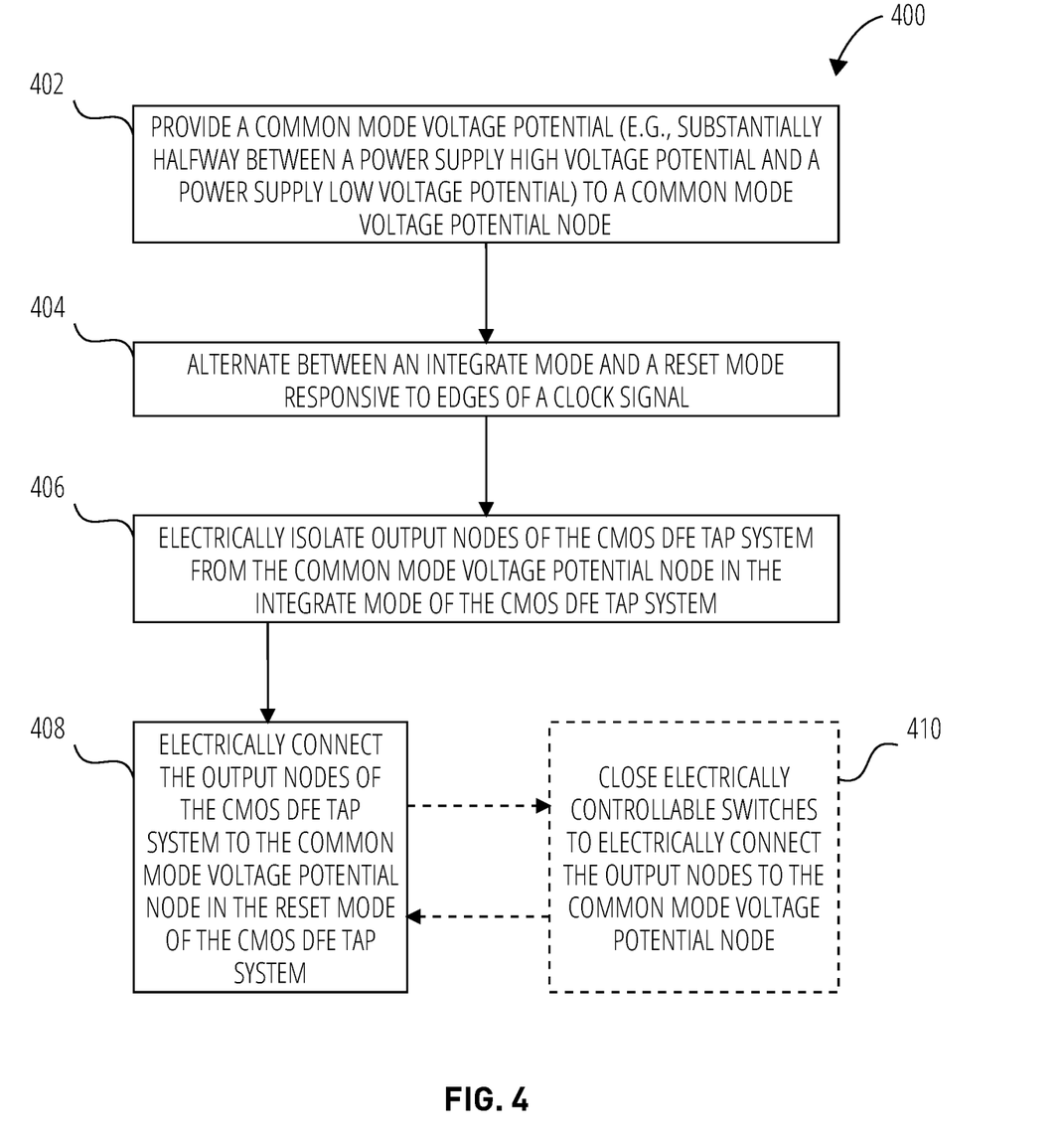
FIG. 4 is a flowchart illustrating a method of operating a CMOS DFE tap system, according to some examples.

FIG. 4 is a flowchart illustrating a method 400 of operating a CMOS DFE tap system (e.g., the CMOS DFE tap system 200 of FIG. 2), according to some examples. At operation 402, the method 400 includes providing a common mode voltage potential (e.g., the common mode voltage potential VCM of FIG. 2) to a common mode voltage potential node (e.g., the common mode voltage potential node 212 of FIG. 2).

At operation 404, the method 400 includes alternating between an integrate mode (e.g., the integrate mode 306 of FIG. 3) and a reset mode (e.g., the reset mode 308 of FIG. 3) responsive to a clock signal (e.g., the clock signal CLKB of FIG. 2, the clock signal 302 of FIG. 3). By way of non-limiting example, when the clock signal is at a high logic level the CMOS DFE tap system may operate in an integrate phase, and when the clock signal is at a low logic level the CMOS DFE tap system may operate in a reset mode.

At operation 406, the method 400 includes electrically isolating output nodes (e.g., the output nodes 110 of FIG. 1 and FIG. 2) of the CMOS DFE tap system from the common mode voltage potential node in the integrate mode of the CMOS DFE tap system.

At operation 408, the method 400 includes electrically connecting the output nodes of the CMOS DFE tap system to the common mode voltage potential node in the reset mode of the CMOS DFE tap system. In some examples, electrically connecting the output nodes of the CMOS DFE tap system to the common mode voltage potential node includes closing electrically controllable switches to electrically connect the output nodes to the common mode voltage potential node at operation 410.

EXAMPLES

A non-exhaustive, non-limiting list of examples follows. Not each of the examples listed below is explicitly and individually indicated as being combinable with all others of the examples listed below and examples discussed above. It is intended, however, that these examples are combinable with all other examples unless it would be apparent to one of ordinary skill in the art that the examples are not combinable.

Example 1: An apparatus, comprising output nodes to provide output signals, a complementary metal-oxide-semiconductor (CMOS) decision feedback equalization (DFE) tap electrically connected to the output nodes, and a current integrating summer electrically connected to the output nodes, the current integrating summer to reset the output nodes to a common mode voltage potential.

Example 2: The apparatus of Example 1, wherein the current integrating summer includes both pull-up current sources and pull-down current sources and the output nodes are electrically connected, respectively, between the pull-up current sources and the pull-down current sources.

Example 3: The apparatus according to any one of Examples 1 and 2, wherein the current integrating summer includes a common mode voltage potential node selectively electrically connectable to the output nodes.

Example 4: The apparatus of Example 3, wherein the current integrating summer includes electrically controllable switches electrically connected from the output nodes to the common mode voltage potential node and from one of the output nodes to another of the output nodes.

Example 5: The apparatus of Example 4, wherein the electrically controllable switches are controlled using a clock signal.

Example 6: The apparatus according to any one of Examples 1-5, wherein during an integrate mode the current integrating summer is to maintain a first output signal of the output signals higher than the common mode voltage potential and a second output signal of the output signals lower than the common mode voltage potential for substantially an entirety of the integrate mode.

Example 7: The apparatus according to any one of Examples 1-6, wherein transistors of the CMOS DFE tap are sized to accommodate a signal current but not a common mode current.

Example 8: The apparatus according to any one of Examples 1-7, wherein the CMOS DFE tap includes both a pull-up current source and a pull-down current source.

Example 9: The apparatus according to any one of Examples 1-8, wherein the common mode voltage potential is substantially halfway between a power supply high voltage potential and a power supply low voltage potential.

Example 10: A method of operating a complementary metal-oxide-semiconductor (CMOS) decision feedback equalization (DFE) tap system, the method comprising providing a common mode voltage potential at substantially halfway between a power supply low voltage potential and a power supply high voltage potential to a common mode voltage potential node, electrically isolating output nodes of the CMOS DFE tap system from the common mode voltage potential node in an integrate mode of the CMOS DFE tap system, and electrically connecting the output nodes of the CMOS DFE tap system to the common mode voltage potential node in a reset mode of the CMOS DFE tap system.

Example 11: The method of Example 10, wherein electrically connecting the output nodes of the CMOS DFE tap system to the common node voltage potential node comprises closing electrically controllable switches to electrically connect the output nodes to the common mode voltage potential node.

Example 12: The method according to any one of Examples 10 and 11, comprising alternating between the integrate mode and the reset mode responsive to a clock signal.

Example 13: An apparatus, comprising a receiver to receive, via a communication channel, an input signal from a transmitter, the receiver including a complementary metal-oxide-semiconductor (CMOS) decision feedback equalization (DFE) tap system, the CMOS DFE tap system including a current integrating summer to reset output nodes of the CMOS DFE tap system to a common mode voltage potential that is substantially halfway between a power supply high voltage potential and a power supply low voltage potential.

Example 14: The apparatus of Example 13, wherein the receiver is a peripheral communication interface express receiver.

Example 15: The apparatus according to any one of Examples 13 and 14, wherein the CMOS DFE tap system includes a CMOS DFE tap electrically connected to the output nodes.

Example 16: The apparatus of Example 15, wherein the CMOS DFE tap includes pairs of pull-up transistors including pull-up drain terminals and pairs of pull-down transistors including pull-down drain terminals, the pull-down drain terminals electrically connected to the pull-up drain terminals, the pull-down drain terminals and the pull-up drain terminals electrically connected to the output nodes.

Example 17: The apparatus according to any one of Examples 13-16, wherein the current integrating summer includes electrically controllable switches electrically connected from a common mode voltage potential node to the output nodes.

Example 18: The apparatus of Example 17, wherein the current integrating summer includes an electrically controllable switch to selectively electrically connect the output nodes together.

Example 19: The apparatus of Example 18, wherein the electrically controllable switches and the electrically controllable switch are controlled responsive to a clock signal.

Example 20: A CMOS DFE tap system, comprising output nodes configured to provide output signals, a CMOS DFE tap electrically connected to the output nodes, and a current integrating summer electrically connected to the CMOS DFE tap and the output nodes, the current integrating summer configured to reset output nodes of the CMOS DFE tap system to a common mode voltage potential.

Example 21: The CMOS DFE tap system of Example 20, wherein the current integrating summer includes both pull-up current sources and pull-down current sources.

Example 22: The CMOS DFE tap system according to any one of Examples 20 and 21, wherein the current integrating summer includes a common mode voltage potential node selectively electrically connectable to the output nodes responsive to a clock signal.

Example 23: The CMOS DFE tap system according to any one of Examples 20-22, wherein during an integrate mode the current integrating summer is configured to maintain a first output signal of the output signals higher than the common mode voltage potential and a second output signal of the output signals lower than the common mode voltage potential for substantially the entire integrate mode.

Example 24: The CMOS DFE tap system according to any one of Examples 20-23, wherein transistors of the CMOS DFE tap are sized to accommodate a signal current but not a common mode current.

Example 25: The CMOS DFE tap system according to any one of Examples 20-24, wherein the CMOS DFE tap includes both a pull-up current source and a pull-down current source.

Example 26: A method of operating a CMOS DFE tap system, the method comprising providing a common mode voltage potential to a common mode voltage potential node, electrically isolating output nodes of the CMOS DFE tap system from the common mode voltage potential node in an integrate mode of the CMOS DFE tap system, and electrically connecting the output nodes of the CMOS DFE tap system to the common mode voltage potential node in a reset mode of the CMOS DFE tap system.

Example 27: A receiver comprising a CMOS DFE tap system, the CMOS DFE tap system including a current integrating summer configured to reset output nodes of the CMOS DFE tap system to a common mode voltage potential.

Example 28: A receiver comprising the CMOS DFE tap system according to any one of Examples 20-25.

Example 29: The receiver of Example 28, wherein the receiver is a peripheral communication interface express receiver.

CONCLUSION

As used in the present disclosure, the terms "module" or "component" may refer to specific hardware implementations to perform the actions of the module or component and/or software objects or software routines that may be stored on and/or executed by general purpose hardware (e.g., computer-readable media, processing devices, etc.) of the computing system. In some examples, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

What is claimed is:

1. An apparatus, comprising:
    output nodes that provide output signals;
    a complementary metal-oxide-semiconductor (CMOS) decision feedback equalization (DFE) tap electrically connected to the output nodes, transistors of the CMOS DFE tap sized to accommodate a signal current but not a common mode current; and
    a current integrating summer that resets the output nodes to a common mode voltage potential, the current integrating summer electrically connected to the output nodes.

2. The apparatus of claim 1, wherein:
    the current integrating summer includes both pull-up current sources and pull-down current sources; and
    the output nodes are electrically connected, respectively, between the pull-up current sources and the pull-down current sources.

3. The apparatus of claim 1, wherein the current integrating summer includes a common mode voltage potential node selectively electrically connectable to the output nodes.

4. The apparatus of claim 3, wherein the current integrating summer includes electrically controllable switches electrically connected from the output nodes to the common mode voltage potential node and from one of the output nodes to another of the output nodes.

5. The apparatus of claim 4, wherein the electrically controllable switches are controlled using a clock signal.

6. The apparatus of claim 1, wherein during an integrate mode the current integrating summer maintains a first output signal of the output signals higher than the common mode voltage potential and a second output signal of the output signals lower than the common mode voltage potential for substantially an entirety of the integrate mode.

7. The apparatus of claim 1, wherein the CMOS DFE tap includes both a pull-up current source and a pull-down current source.

8. The apparatus of claim 1, wherein the common mode voltage potential is substantially halfway between a power supply high voltage potential and a power supply low voltage potential.

9. A method of operating a complementary metal-oxide-semiconductor (CMOS) decision feedback equalization (DFE) tap system, the method comprising:
    providing a common mode voltage potential at substantially halfway between a power supply low voltage potential and a power supply high voltage potential to a common mode voltage potential node;
    electrically isolating output nodes of the CMOS DFE tap system from the common mode voltage potential node in an integrate mode of the CMOS DFE tap system; and
    electrically connecting the output nodes of the CMOS DFE tap system to the common mode voltage potential node in a reset mode of the CMOS DFE tap system.

10. The method of claim 9, wherein electrically connecting the output nodes of the CMOS DFE tap system to the common node voltage potential node comprises closing electrically controllable switches to electrically connect the output nodes to the common mode voltage potential node.

11. The method of claim 9, comprising alternating between the integrate mode and the reset mode responsive to a clock signal.

12. An apparatus, comprising:
    a receiver that receives, via a communication channel, an input signal from a transmitter, the receiver including a complementary metal-oxide-semiconductor (CMOS) decision feedback equalization (DFE) tap system, the CMOS DFE tap system including a current integrating summer that resets output nodes of the CMOS DFE tap system to a common mode voltage potential that is substantially halfway between a power supply high voltage potential and a power supply low voltage potential.

13. The apparatus of claim 12, wherein the receiver is a peripheral communication interface express receiver.

14. The apparatus of claim 12, wherein the CMOS DFE tap system includes a CMOS DFE tap electrically connected to the output nodes.

15. The apparatus of claim 14, wherein the CMOS DFE tap includes:
    pairs of pull-up transistors including pull-up drain terminals; and
    pairs of pull-down transistors including pull-down drain terminals, the pull-down drain terminals electrically connected to the pull-up drain terminals, the pull-down drain terminals and the pull-up drain terminals electrically connected to the output nodes.

16. The apparatus of claim 12, wherein the current integrating summer includes electrically controllable switches electrically connected from a common mode voltage potential node to the output nodes.

17. The apparatus of claim 16, wherein the current integrating summer includes an electrically controllable switch that selectively electrically connect the output nodes together.

18. The apparatus of claim 17, wherein the electrically controllable switches and the electrically controllable switch are controlled responsive to a clock signal.

* * * * *